United States Patent
Lhee et al.

(10) Patent No.: US 10,497,772 B2
(45) Date of Patent: Dec. 3, 2019

(54) DISPLAY DEVICE HAVING DATA LINES SPACED APART FROM EACH OTHER BY DIFFERENT DISTANCES

(71) Applicant: Samsung Display Co., Ltd., Yongin-si (KR)

(72) Inventors: Zail Lhee, Yongin-si (KR); Mi Na Jung, Yongin-si (KR); Deuk Jong Kim, Yongin-si (KR); Keun Soo Lee, Yongin-si (KR); Ji Hye Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 116 days.

(21) Appl. No.: 15/595,821

(22) Filed: May 15, 2017

(65) Prior Publication Data
US 2018/0090555 A1 Mar. 29, 2018

(30) Foreign Application Priority Data
Sep. 23, 2016 (KR) .................. 10-2016-0122373

(51) Int. Cl.
*G06F 3/038* (2013.01)
*H01L 27/32* (2006.01)
*G09G 3/3233* (2016.01)
*G09G 3/3225* (2016.01)
G09G 3/3266 (2016.01)
G09G 3/3275 (2016.01)
G09G 3/20 (2006.01)
H01L 51/00 (2006.01)

(52) U.S. Cl.
CPC ....... *H01L 27/3288* (2013.01); *G09G 3/3225* (2013.01); *G09G 3/3233* (2013.01); *H01L 27/3276* (2013.01); *G09G 3/2003* (2013.01); *G09G 3/3266* (2013.01); *G09G 3/3275* (2013.01); *G09G 2300/0426* (2013.01); *G09G 2310/08* (2013.01); *G09G 2330/02* (2013.01); *H01L 51/0097* (2013.01); *H01L 2251/5338* (2013.01)

(58) Field of Classification Search
CPC ............ H01L 27/3288; H01L 27/3279; G09G 3/3225; G09G 3/3233
USPC ........................................................ 345/211
See application file for complete search history.

(56) References Cited

U.S. PATENT DOCUMENTS

2008/0204618 A1* 8/2008 Jung .................... G02F 1/13452
349/40
2014/0145153 A1* 5/2014 Kim ...................... H01L 27/124
257/40

(Continued)

Primary Examiner — Jonathan M Blancha
(74) Attorney, Agent, or Firm — H.C. Park & Associates, PLC

(57) ABSTRACT

A display device includes a substrate with a display area and a non-display area, pixels disposed in the display area, a first wire extending from the pixels to the non-display area and disposed on the substrate, an insulating layer covering at least the first wire, a second wire extending from the pixels to the non-display area, and a second insulating layer or the first insulating layer covering the second wire, wherein the first wire is disposed on the non-display area either spaced apart from the second wire by a first distance and a second distance that is different from the first distance, or in a position overlapping at least part of the second wire.

14 Claims, 8 Drawing Sheets

(56) References Cited

U.S. PATENT DOCUMENTS

2015/0179727 A1\* 6/2015 Kim .................... H01L 27/3276
257/40
2016/0183382 A1 6/2016 Solven et al.
2016/0321972 A1\* 11/2016 Kang ..................... G09G 3/006

\* cited by examiner

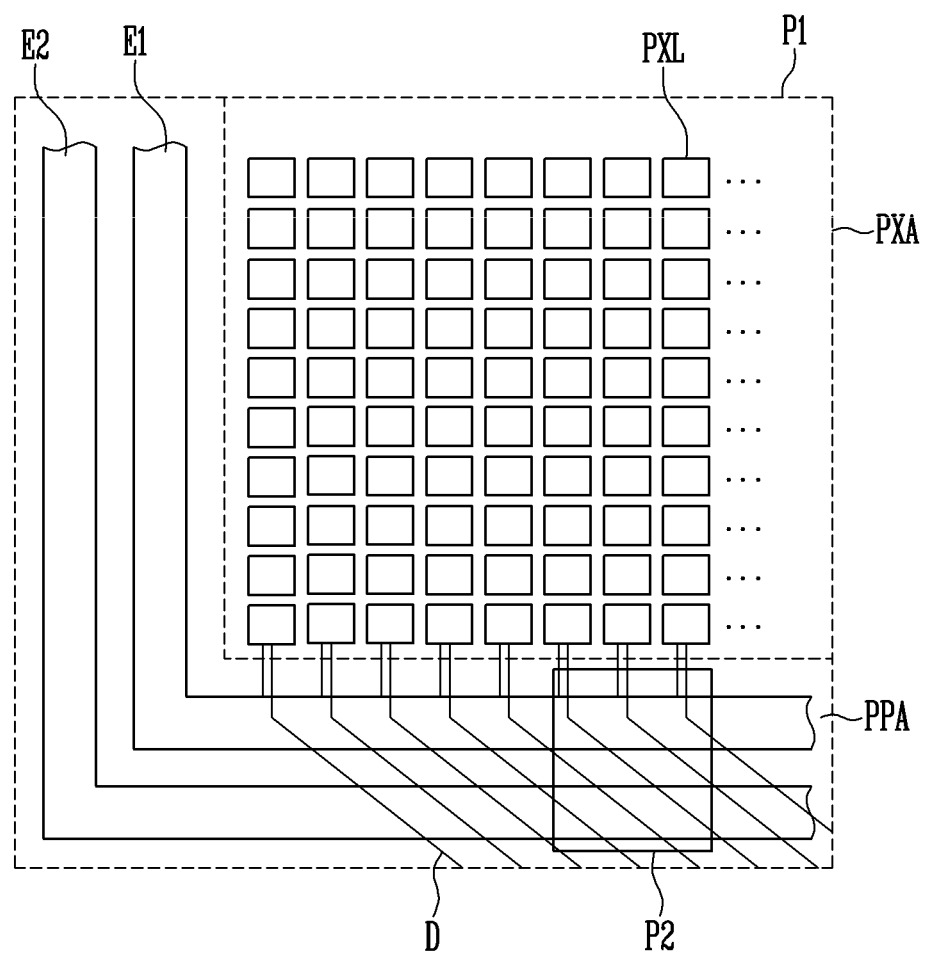

DISPLAY DEVICE HAVING DATA LINES SPACED APART FROM EACH OTHER BY DIFFERENT DISTANCES

CROSS-REFERENCE TO RELATED APPLICATION

This application claims priority from and the benefit of Korean Patent Application No. 10-2016-0122373, filed on Sep. 23, 2016, which is hereby incorporated by reference for all purposes as if fully set forth herein.

BACKGROUND

Field

The invention relates generally to a display device, and, more particularly, to a display device having plural power lines in a display area of the device.

Discussion of the Background

A display device is a device displaying an image, and includes a Liquid Crystal Display device (LCD), a Plasma Display Panel device (PDP), a Field Emission Display device (FED), an Organic Light Emitting Device (OLED), and an Electrophoretic Display Device (EPD) and other types of known display devices.

The display device may include a display area, which displays an image, and a non-display area, which does not display an image. Pixels arranged in a matrix may be disposed in the display area, and each of the pixels may emit light with luminance corresponding to a data signal supplied through a data line in response to an emission control signal.

Further, a data driver, which supplies a data signal to the pixel, and a data line, which connects the pixel and the data driver, may be disposed in the non-display area. Power lines are provided in the display device to supply the requisite current to drive the display and other components in the device. According to recent trends, the area of the non-display area has become gradually decreased, the width of the bezel also has decreased, and therefore the distance between the wires disposed within the non-display area has decreased.

The above information disclosed in this Background section is only for enhancement of understanding of the background of the inventive concepts, and, therefore, it may contain information that does not form the prior art that is already known in this country to a person of ordinary skill in the art.

SUMMARY

Applicants made the invention in an effort to solve the problems described herein, particularly short circuits that may occur between power lines of a display device, and have invented a display device that substantially or completely insulates power supply lines supplying different power sources to pixels. Insulation between the lines may be effected by preventing a residue of a conductive layer from being formed between data lines. Of course, the invention may solve other problems and have other advantages as well.

Additional aspects will be set forth in the detailed description which follows, and, in part, will be apparent from the disclosure, or may be learned by practice of the inventive concepts.

According to a first aspect of the invention a display device includes a substrate including a display area and a non-display area; pixels disposed in the display area; a first wire extending from the pixels to the non-display area and disposed on the substrate; a first insulating layer covering the first wire; a second wire extending from the pixels to the non-display area and disposed on the first insulating layer; and a second insulating layer covering the second wire, where the first wire is disposed on the non-display area spaced apart from the second wire by a first distance and a second distance that is different from the first distance.

The first wire may include a plurality of first wires, and the second wire may include a plurality of second wires, and respective ones of the plurality of first wires and the plurality of second wires are alternately disposed.

The first wire may include a first contoured portion, and the second wire may include a second contoured portion.

The first contoured portion and the second contoured portion may face each other or may be alternately disposed so as not to face each other.

The display device may further comprise a first power wire and a second power wire, and each of the first and second power wires may supply a different size of power to the pixels.

The first and second wires may surround the display area.

Each of the first and second wires may supply a data signal to the pixels.

The display device may further include first and second power lines disposed on the second insulating layer in the non-display area, and configured to supply power to the pixels.

The first wire may be spaced apart from the second wire by the first distance and the second distance between the first and second power lines.

The first and second power lines may be formed of the same material.

The first and second power lines may be formed of different materials.

Widths of the first and second wires may be the same.

Widths of the first and second wires may be different from each other in at least one portion of each of the first and second wires.

At least some of the first and second wires may have a contoured portion.

At least a part of the first wire and at least a part of the second wire may be disposed to be parallel to each other.

According to a second aspect of the invention, a display device includes a substrate including a display area and a non-display area; pixels disposed in the display area; first and second wires extending from the pixels to the non-display area and disposed on the substrate; and an insulating layer configured to cover the first and second wires, where the first wire is disposed on the non-display area in a position overlapping at least part of the second wire.

The first wire may include a plurality of first wires, the second wire may include a plurality of second wires, and respective ones of the first wires and the second wires may be alternately disposed.

The first wire may include a first contoured portion, and the second wire may include a second contoured portion, and the first contoured portion and the second contoured portion may be disposed so as face each other.

The first wire and the second wire may overlap each other along a substantial portion of their respective longitudinal extents.

According to a third aspect of the invention, a display device includes a substrate including a display area and a non-display area, pixels disposed in the display area, first and second wires extending from the pixels to the non-display area, and disposed on the substrate, and an insulating layer covering the first and second wires, wherein the first wires are disposed on the non-display area spaced apart from the second wires by a first distance and a second distance that is different from the first distance.

In the display device according to the invention described herein, it is possible to effectively remove a residue of a conductive layer formed between data lines by including a recessed portion, which is formed between the data lines, thereby substantially or completely insulating the power lines supplying different power sources.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 3 is an enlarged, schematic top plan view of area P1 of FIG. 2.

DETAILED DESCRIPTION OF THE ILLUSTRATED EMBODIMENTS

Figure 1:
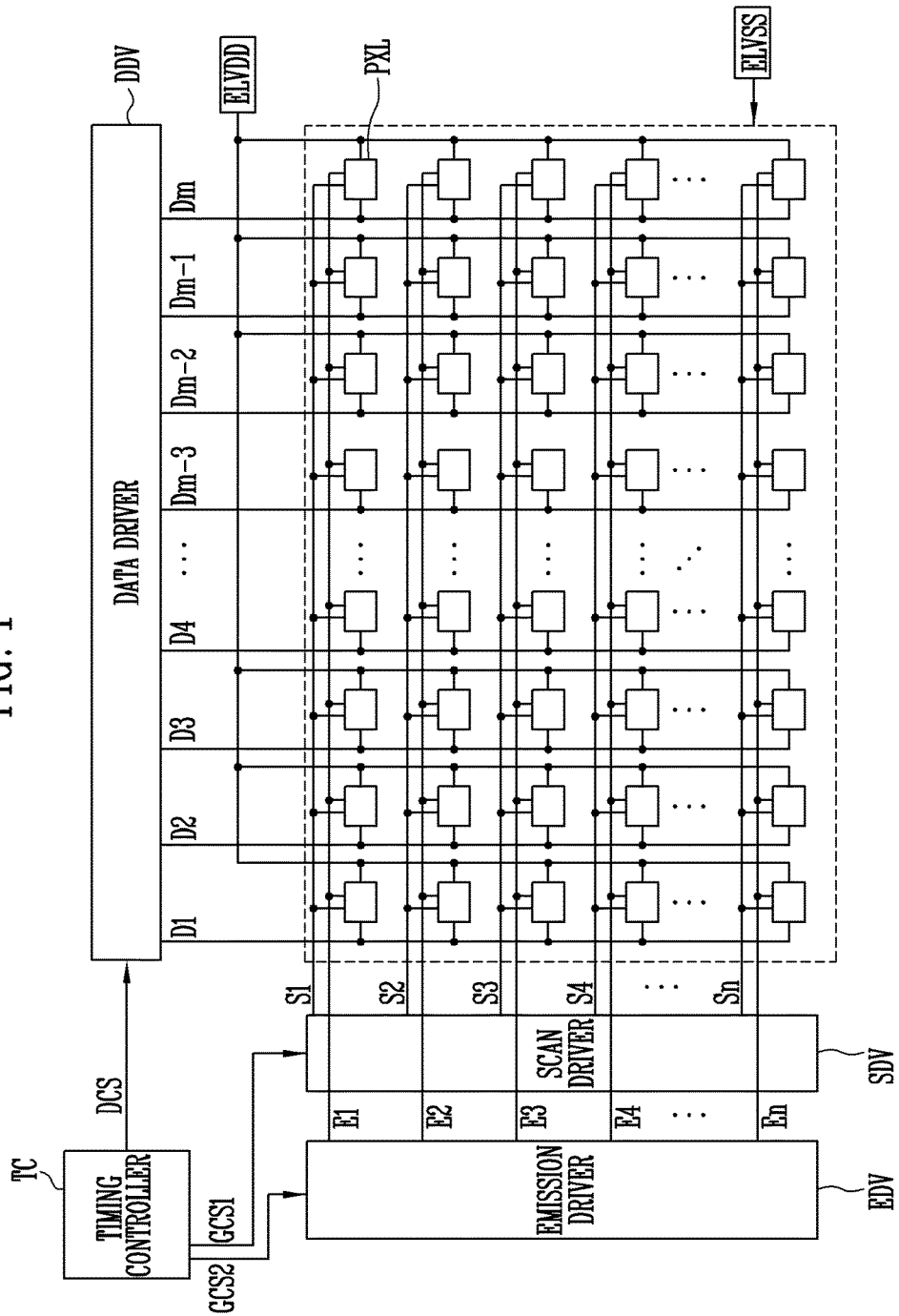
FIG. 1 is a schematic diagram of a display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 1, a display device includes a timing controller TC, an emission driver EDV, a scan driver SDV, a data driver DDV, and pixels PXL.

The display device may be any one of a Personal Computer (PC), a smart phone, a tablet PC, a Mobile Internet Device (MID), an internet tablet PC, an Internet of Things (IoT) device, an Internet of Everything (IoE) device, a desktop computer, a laptop computer, a workstation computer, and a Personal Digital Assistant (PDA), and any other currently known or later developed display device.

The timing controller TC may generate gate control signals GCS1 and GCS2 and a data control signal DCS based on control signals supplied from the outside.

The gate control signals GCS1 and GCS2 may include a start pulse, which controls a timing of the first scan signal or controls a timing of the first emission control signal, and clock signals for shifting the start pulse.

The data control signal DCS may include a source start pulse controlling a sampling start point of data, and clock signals controlling a sampling operation.

The timing controller TC may supply a first gate control signal GCS1 to the scan driver SDV, supply a second gate control signal GCS2 to the emission driver EDV, and supply a data control signal DCS to the data driver DDV.

The scan driver SDV may supply a scan signal to scan lines S1 to Sn in response to the first gate control signal GCS1. For example, the scan driver SDV may sequentially supply a scan signal to the scan lines S1 to Sn.

The emission driver EDV may supply an emission control signal to emission control lines E1 to En in response to the second gate control signal GCS2. For example, the emission driver EDV may sequentially supply an emission control signal to the emission control lines E1 to En.

The data driver DDV may generate a data signal by using the data control signal DCS, and supply a data signal to the pixels PXL through data lines D1 to Dm.

The pixels PXL may be provided in an n×m matrix. The pixels PXL may be disposed in a display area PXA, and may be connected to the scan lines S1 to Sn, the emission control lines E1 to En, and the data lines D1 to Dm.

When a scan signal is supplied from the scan lines S1 to Sn, the pixels PXL may receive a data signal from the data lines D1 to Dm. Each of the pixels PXL may emit light with luminance corresponding to the amount of current flowing from a first power source ELVDD to a second power source ELVSS based on a data signal.

Figure 2:
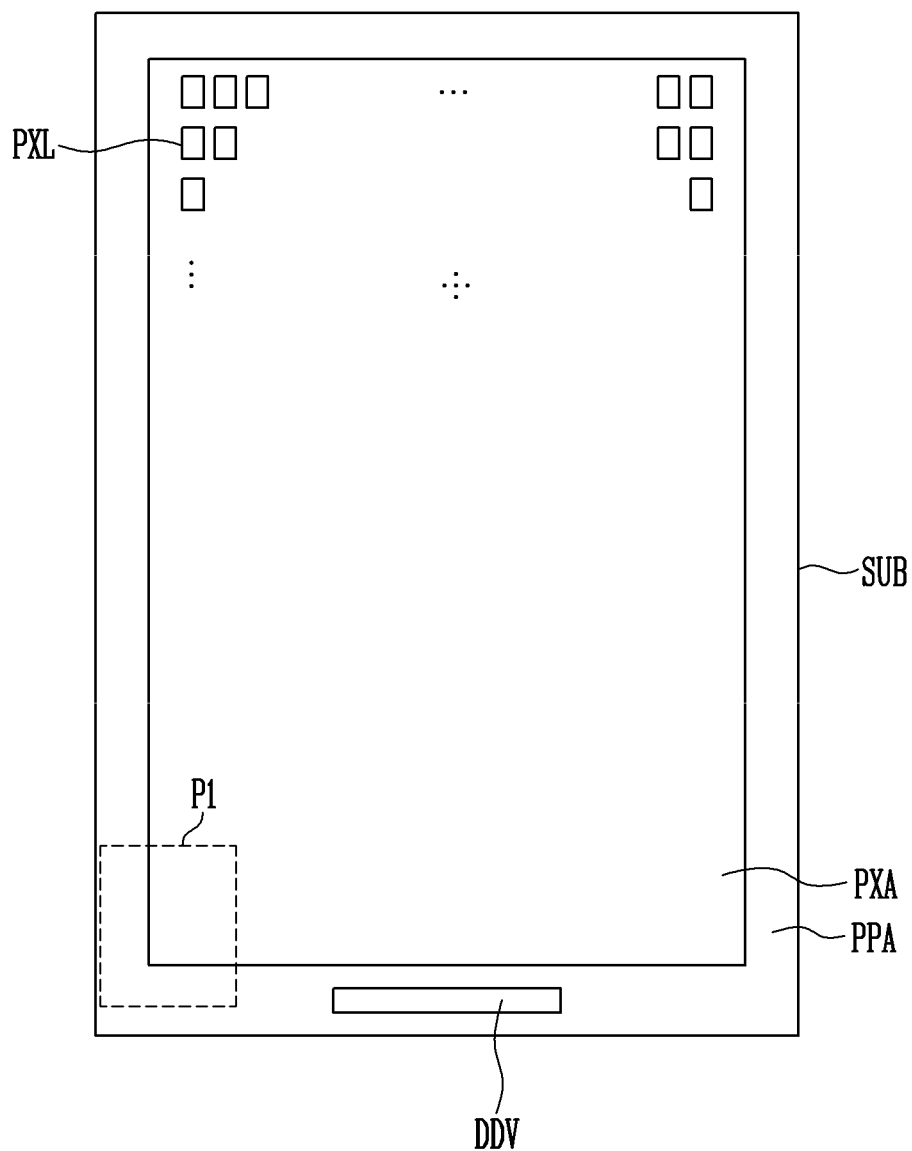
FIG. 2 is a schematic, top plan view of a display device constructed according to the principles of the invention.

FIG. 2 is a schematic, top plan view of a display device constructed according to the principles of the invention.

For convenience of the description, FIG. 2 illustrates a case where a substrate SUB is formed of one region as an example, but the number of regions provided in the substrate SUB may be different. When the number of regions provided in the substrate SUB is two or more, each region may have the same area, or two or more of the regions may have different areas.

Referring to FIG. 2, a display device may include a substrate SUB, pixels PXL provided on the substrate SUB, a data driver provided on the substrate SUB and providing a data signal to the pixels PXL, and wires (not illustrated) connecting the pixels PXL and the data driver.

The substrate SUB may have various shapes. For example, the substrate SUB may be provided in various shapes, such as a polygon having a closed shape including a straight side, a circle and an ellipse including a curved side, and a semicircle and a half ellipse including a side formed of a straight line and a curved line.

When the substrate SUB includes a plurality of areas, each area may also be provided in various shapes, such as a polygon having a closed shape including a straight side, a circle and an ellipse including a curved side, and a semicircle and a half ellipse including a side formed of a straight line and a curved line.

The substrate SUB may include a pixel area PXA and a non-display area PPA. The display area PXA is an area in which the pixels PXL displaying an image are provided, and the non-display area PPA is an area in which the pixels PXL are not provided, and an image is not displayed.

The display area PXA may be provided in a shape corresponding to that of the substrate SUB, and the non-display area PPA may be provided in at least one side of the display area PXA. The non-display area PPA is illustrated in a form surrounding the display area PXA, but the non-display area PPA may be disposed in the remaining regions.

The pixels PXL may be disposed on the display area PXA of the substrate SUB. Each pixel PXL may include an organic light emitting device emitting white light or color light as a minimum unit displaying an image.

For example, the pixel PXL may emit any one of red, green, and blue, but is not limited thereto, and may emit a color, such as cyan, magenta, and yellow.

The pixels PXL may be disposed in a matrix, but the arrangement of the pixels PXL is not particularly limited, and the pixels PXL may be arranged in various forms.

For example, a part of the pixels PXL may be disposed to be parallel to a short axis of the display area PXA, but the other part of the pixels PXL may be disposed in a direction, which is not parallel to the short axis of the display area PXA.

A data driver DDV for providing a data signal to the pixels PXL, and wires connecting the pixels PXL and the data driver DDV may be disposed in the non-display area PPA. The non-display area PPA may correspond to a bezel in the final display device, and the width of the bezel may be determined according to the width of the non-display area PPA.

The data driver DDV may provide a data signal to each of the pixels PXL through data lines D1 to Dm. The data driver DDV may be disposed in the non-display area PPA.

For example, the data driver DDV may be disposed in a side of the non-display area PPA having a short axis, and may be elongated along the width direction of the non-display area PPA.

A scan driver SDV, an emission driver EDV, and a timing controller TC may be included. The timing controller TC may generate gate control signals GCS1 and GCS2 and a data control signal DCS, the scan driver SDV may provide a scan signal to the pixels PXL through scan lines, and the emission driver EDV may provide an emission control signal to the pixels PXL through an emission control line.

FIG. 3 shows a portion corresponding to P1 of FIG. 2. For convenience of the description of a connection relation between the respective wires, FIG. 3 illustrates only a part of data lines and power supply lines. It should be understood that other scan lines, emission control lines, and the like may be additionally provided.

Referring to FIG. 3, a substrate SUB may be divided into a display area PXA and a non-display area PPA, and pixels PXL may be disposed in a matrix within the display area PXA. The display area PXA as shown has a side having a straight shape, but may have a side having a curve shape.

For convenience of the description, only one side portion of the display area PXA is illustrated, but the other side portion of the display area PXA may be formed in substantially the same scheme so that the shape of the display area PXA is bilaterally symmetric.

A data driver DDV (see FIG. 2) may be provided in the non-display area PPA. Corresponding data lines D may be connected to each of the pixel columns. The data lines D may be connected to the data driver DDV. For convenience of the description, FIG. 3 illustrates that the data lines D are connected only to the outermost pixels of each pixel column, but each of the data lines D may be connected to all of the pixels PXL provided in each pixel column, and the pixels in the same column may share the same data line. The data lines D may extend in the direction of the pixel column within the display area PXA. The data lines D may extend further in the direction of the pixel column into the non-display area PPA, but may be bent in a predetermined region and may be inclined relative to the direction of the pixel column. The data lines D extend so as to be oriented in the direction of the data driver DDV, and form a data line pan out part having a shape spread out from the data driver DDV in the direction of the pixels PXL.

First and second power lines E1 and E2 may be connected to each of the pixel columns. FIG. 3 illustrates that only the first power line E1 is connected only to the outermost pixel in each pixel column, but the power lines E1 and E2 may be connected to other pixel columns and in other orientations as well, and a wire(s) connected with the second power line E2 and the pixel may be separately provided. Further, each of the first power line E1 and the second power line E2 may be connected to all of the pixels PXL provided in each pixel column, and the pixels in the same column may share the same first and second power lines E1 and E2.

The first power line E1 and the second power line E2 may extend in the non-display area PPA along a border of the display area PXA. The first power line E1 and the second power line E2 may have a straight shape, but may also, or alternatively, have a curved shape. Further, the first power line E1 and the second power line E2 may be bent at a right (or other) angle at a corner of the display area PXA, but may also have a curved shape. Further, each of the first power line E1 and the second power line E2 may have a predetermined width, but are not limited thereto, and may have different and/or varying widths.

The first power line E1 may supply a first power source ELVDD to the pixels PXL, and the second power line E2 may supply a second power source ELVSS to the pixels PXL. The first power source ELVDD may have a higher voltage than that of the second power source ELVSS. Alternatively, the first power line E1 may supply a second power source ELVSS to the pixels PXL, and the second power line E2 may supply a first power source ELVDD to the pixels PXL.

Each of the first power line E1 and the second power line E2 may be oriented to be parallel or substantially parallel to the pixel row. Alternatively, each of the first power line E1 and the second power line E2 may have a predetermined inclination with respect to the pixel row.

Figure 4A:
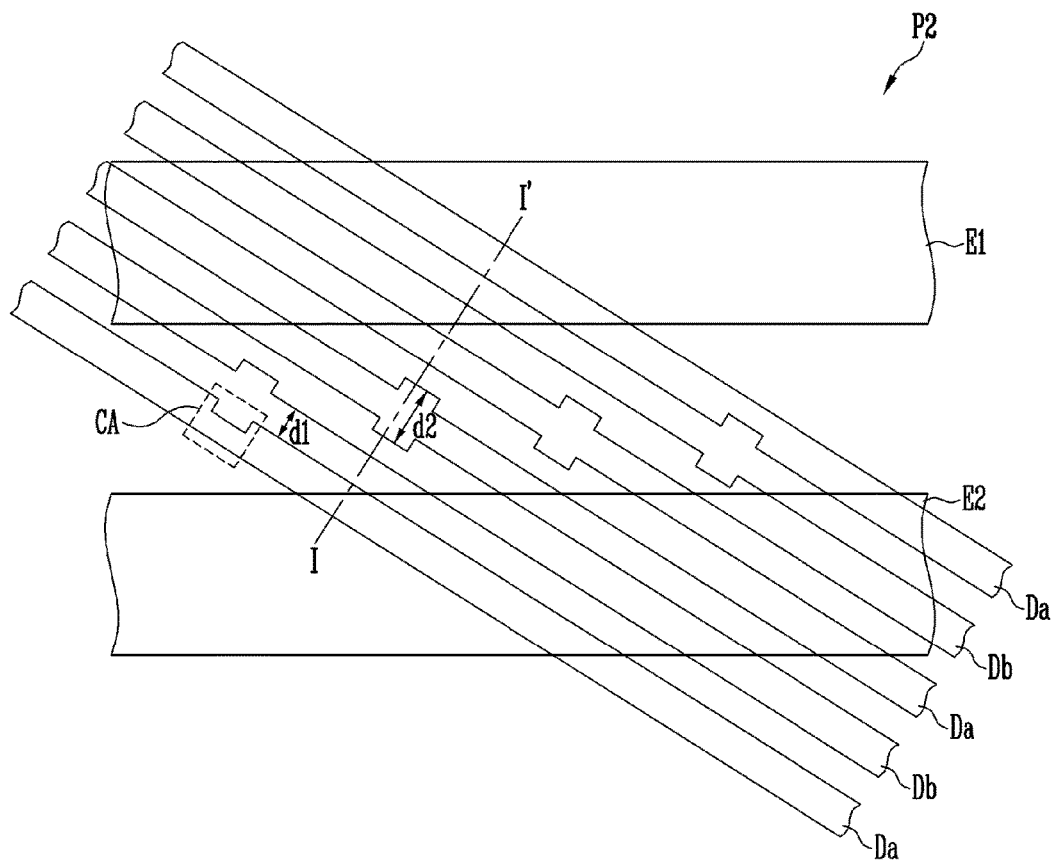
FIG. 4A is a fragmented, top plan view of a first embodiment of area P2 of FIG. 3.
Figure 4B:
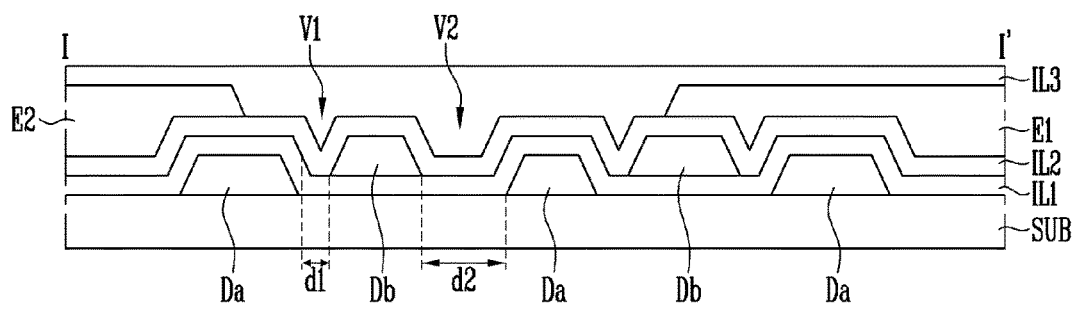
FIGS. 4B and 4C are cross-sectional views of alternative embodiments taken along line I-I' of FIG. 4A.
Figure 4C:
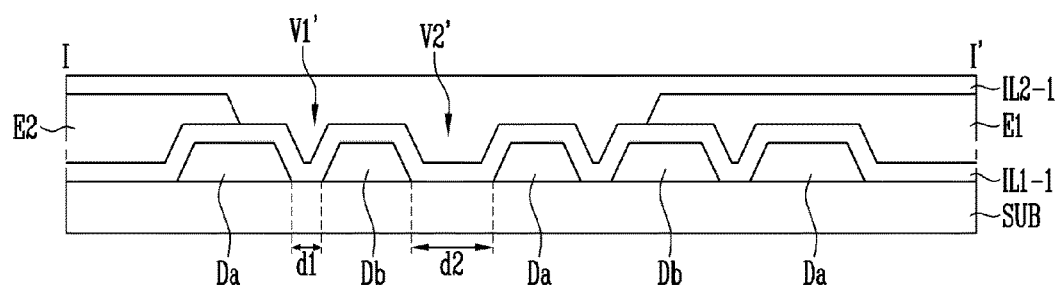

FIG. 4A is a fragmented, top plan view of a first embodiment of area P2 of FIG. 3. FIGS. 4B and 4C are cross-sectional views of alternative embodiments taken along line I-I' of FIG. 4A.

FIGS. 4A, 4B, and 4C illustrate a connection relationship between the respective wires in detail, and for convenience of the description, some of the first and second data lines Da and Db and some of the first and second power lines E1 and E2 are illustrated. FIG. 4B illustrates an embodiment, in which the first and second data lines Da and Db are formed in different layers, and FIG. 4C illustrates an alternative embodiment, in which the first and second data lines Da and Db are formed in the same layer.

Scan lines, emission control lines, data lines, and other power lines may also be provided as is known in the art but are omitted from these figures for clarity. Further, as shown, each of the first and second data lines Da and Db and first and second power lines E1 and E2 has a straight shape, but they may also or alternatively be formed of a curve line or a combination of a straight line and a curve line. Further, as shown, each of the first and second data lines Da and Db and first and second power lines E1 and E2 has a predetermined width, but they may have different and or varying widths.

Referring to FIG. 4A, the first and second data lines Da and Db may extend from the display area PXA (see FIG. 3) to the non-display area PPA in a first direction. FIG. 4A illustrate an embodiment where the first and second data lines Da and Db extend in an inclined direction with respect to the first and second power lines E1 and E2.

The first data lines Da and the second data lines Db may be alternately disposed when viewed in plan. Further, the first data lines Da and the second data lines Db may be separated by a first relatively predetermined distance d1 when viewed in plan therebetween, but are not limited to such a configuration. For example, the first data lines Da and the second data lines Db may be separate at different and/or variable distances therebetween.

At least some of the first data lines Da and the second data lines Db may extend in parallel or substantially parallel.

Each of the first and second data lines Da and Db may have a contoured portion CA, which is formed in a direction intersecting the first direction, such as the direction traversed by sectional line I-I'. The contoured portion may be provided in the form of an inset or recess having a generally concave shape extending inwardly from the outermost periphery of the data line. For ease of description, the contoured portion CA is referred to in this specification as concave portion CA but any shape inset or recess may be employed. In the embodiment of FIG. 4A, all of the first and second data lines Da and Db include the concave portion CA, but the concave portion CA may alternatively be formed only in fewer than all of the data lines including in any one of the adjacent first and second data lines Da and Db. For example, in another embodiment the concave portion CA may be formed in the first data lines DA, but the concave portion CA might not be formed in the second data lines Db.

Each of the first and second data lines Da and Db may include one concave portion CA, no concave portion CA, or a plurality of concave portions CA.

The number of concave portions CA included in each of the first data lines Da and the second data line Db may be different. For example, each of the first data lines Da may have n concave portions CA (n is a natural number), and each of the second data lines Db may have m concave portions CA (m is a natural number different from n).

At least some of the first data lines Da may have the different number of concave portions CA. For example, some of the first data lines Da may have p concave portions CA (p is a natural number), and the remaining one or more of the first data lines Da may have q concave portions CA (q is a natural number different from p). At least some of the second data lines Db may also have the same or different number of concave portions CA similar to the manner described above in connection with the first data lines Da.

The concave portions CA included in the first and second data lines Da and Db may be disposed between the first power line E1 and the second power line E2. It should be understood that, as the term "between" is used herein, it may mean literally between; and, it may also mean appearing to be between when viewed from a particular direction, but not literally between. Further, each of the first and second data lines Da and Db may include the concave portions CA, with the concave portions of the first data line Da being referred to as first concave portions and the concave portions of second data lines Db being referred to as second concave portions. At least one concave portion CA may be disposed between the first power line E1 and the second power line E2.

When the first data lines Da include first concave portions, and the second data lines Db include second concave portions, the first concave portion and the second concave portion may be opposed such that their respective openings face each other. In FIG. 4A the first concave portions of the first data lines Da face the second concave portions of the second data lines Db, but other orientations are permitted. For example, the first concave portion and the second concave portion may be alternately disposed, or some of the first concave portions and the second concave portions may face each other and the remaining of the first concave portions and the second concave portions may be alternately disposed such that their openings do not directly face each other.

Further, the sequentially disposed scan lines and emission control lines may include concave portions corresponding to the concave portion CA of the data line.

The first and second power lines E1 and E2 may be extended in a second direction different from the first direction, in which the first and second data lines Da and Db extend.

Further, similar to the first and second data lines Da and Db, each of the first and second power lines E1 and E2 may include one concave portion or a plurality of concave portions.

Next, a structure of a wiring unit in the non-display area PPA will be described in a lamination sequence.

Referring to FIG. 4B, the first data lines Da are provided on the substrate SUB. The first data lines Da may be disposed with a predetermined distance therebetween or one or more variable distances therebetween.

A first insulating layer IL1 covering the first data lines Da may be disposed on the first data lines Da.

The second data lines Db may be disposed on the first insulating layer IL1, and the second data lines Db may be disposed so as not to overlap the first data lines Da. The first data lines Da and the second data lines Db may be spaced apart from each other by the first distance d1.

In a region that includes the first concave portions of the first data lines Da and the second concave portions of the second data lines Db, the first data lines Da and the second data lines Db may be spaced apart from each other with a second distance d2 greater than the first distance d1.

A second insulating layer IL2 covering the second data lines Db may be disposed on the second data lines Db, and the first and second power lines E1 and E2 may be disposed on the second insulating layer IL2.

The first power line E1 and the second power line E2 may be formed of the same material in the same process. Accordingly, the first power line E1 and the second power line E2 may be formed on the same layer.

Alternatively, the first power line E1 and the second power line E2 may be formed on different layers. That is, the first power line E1 and the second power line E2 may be formed by using different materials in different processes.

A third insulating layer IL3 covering the first and second power lines E1 and E2 may be disposed on the first and second power lines E1 and E2.

Referring to FIG. 4C, first, the first data lines Da and the second data lines Db are provided on the substrate SUB. Each of the first data lines Da and the second data lines Db may be disposed with a predetermined distance therebetween or with different and/or variable distances therebetween.

The first data lines Da and the second data lines Db may be spaced apart from each other with the first distance d1.

In a region that includes the first concave portions of the first data lines Da and the second concave portions of the second data lines Db, the first data lines Da and the second data lines Db may be spaced apart from each other with a second distance d2 different from the first distance d1.

A first insulating layer IL1-1 covering the first data lines Da and the second data lines Db may be disposed on the first data lines Da and the second data lines Db.

The first and second power lines E1 and E2 may be disposed on the first insulating layer IL1-1.

The first power line E1 and the second power line E2 may be formed by using the same material in the same process. Accordingly, the first power line E1 and the second power line E2 may be formed on the same layer.

Alternatively, the first power line E1 and the second power line E2 may be formed on different layers. That is, the first power line E1 and the second power line E2 may be formed of different materials in different processes.

A second insulating layer IL2-1 covering the first and second power lines E1 and E2 may be disposed on the first and second power lines E1 and E2.

The display device described herein has an advantage in that, because the concave portions CA formed in the first and second data lines Da and Db are disposed between the first power line E1 and the second power line E2, it is possible to prevent the first power line E1 and the second power line E2 from being short-circuited.

This will be described in greater detail below.

In the related art, the area of the non-display area PPA has gradually decreased according to recent trends, in which the width of the bezel is decreased, and the distance between the wires disposed within the non-display area PPA has also decreased.

Like the exemplary embodiment illustrated in FIG. 4B, when the second data lines Db are formed on the first insulating layer IL1 as wires and the second insulating layer IL2 is formed on the first insulating layer IL1, first recessed portions V1 may be formed between the first data lines Da and the second data lines Db. That is, when the space between the first data line Da and the second data line Db is very narrow, the width of the first recessed portion V1 may also be formed very small.

In this state, when a conductive layer is formed and the conductive layer is patterned by photolithography and the like in order to form the first and second power lines E1 and E2 on an upper surface of the second insulating layer IL2, the conductive layer within the first recessed portion V1 may not be completely removed by the small width d1 of the first recessed portion V1.

That is, the conductive layer, which is not completely removed, remains as a residue which causes a short circuit between the first power line E1 and the second power line E2.

Further, in the exemplary embodiment illustrated in FIG. 4C, when the space between the first data line Da and the second data line Db is very narrow, the width of the first recessed portion V1' may also be very small.

In this state, when a conductive layer is formed and the conductive layer is patterned by photolithography and the like in order to form the first and second power lines E1 and E2 on an upper surface of the first insulating layer IL1-1, the conductive layer within the first recessed portion V1' may not be completely removed due to the small width d1 of the first recessed portion V1'.

The distance between the first and second data lines Da and Db may be increased by forming the concave portion CA in the first and second data lines Da and Db in the non-display area PPA. That is, like the exemplary embodiment illustrated in FIG. 4B, when the second data lines Db are formed on the first insulating layer IL1 as wires and the second insulating layer IL2 is formed on the first insulating layer IL1, second recessed portions V2 may be formed between the first data lines Da and the second data lines Db, in which the concave portions CA are formed. The second distance d2 between the first data line and the second data line, in which the second recessed portions V2 are formed, is larger than the first distance d1. Accordingly, when a conductive layer is formed and the conductive layer is patterned by photolithography and the like in order to form the first and second power lines E1 and E2 on an upper surface of the second insulating layer IL2, the conductive layer within the second recessed portion V2 may be completely, or substantially completely, removed due to the relatively larger width of the second recessed portion V2. Accordingly, the first power line E1 and the second power line E2 may be completely, or substantially completely, electrically insulated by the third insulating layer IL3.

Further, in the exemplary embodiment illustrated in FIG. 4C, a second recessed portion V2', which is wider than the first recessed portion V1', may be formed between the first data line Da and the second data line Db. Accordingly, a conductive layer within the second recessed portion V2' may be completely, or substantially completely, removed due to the large width of the second recessed portion V2', and the first power line E1 and the second power line E2 may be completely or substantially electrically insulated by the second insulating layer IL2-1.

The second recessed portions V2 and V2' may be formed in every space between the adjacently disposed first data lines Da and second data lines Db, and may be formed between the first power line E1 and the second power line E2.

Figure 5A:
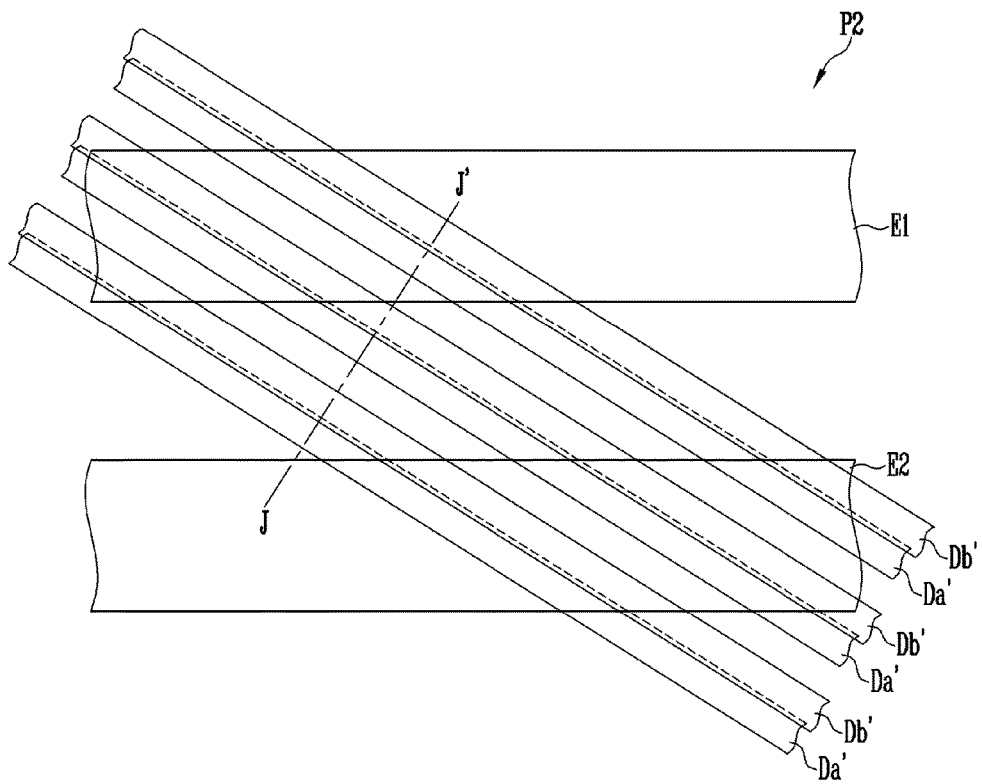
FIG. 5A is a fragmented, top plan view of a second embodiment of area P2 of FIG. 3.
Figure 5B:
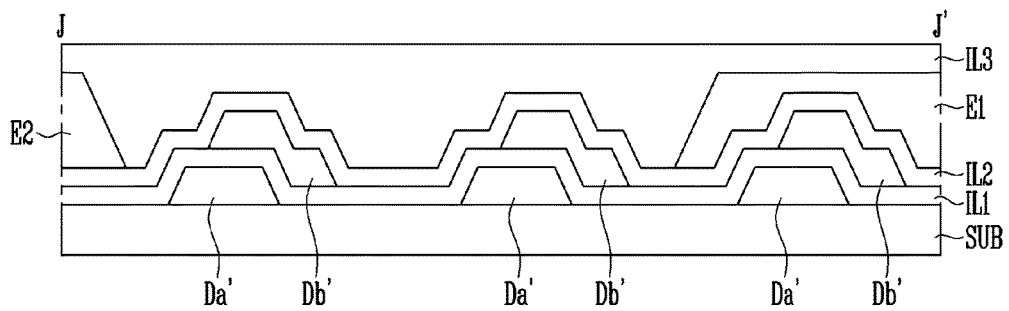
FIG. 5B is a cross-sectional view taken along line J-J' of FIG. 5A.

FIG. 5A is a fragmented, top plan view of a second embodiment of area P2 of FIG. 3. FIG. 5B is a cross-sectional view taken along line J-J' of FIG. 5A.

The display device of FIGS. 5A and 5B will be described focusing on the differences between the display device illustrated in FIGS. 4A and 4B in order to avoid duplicative descriptions. Parts that are not specially described with reference to FIGS. 5A and 5B, will follow those of like parts previously described, and the same reference numeral refers to the same element, and similar reference numerals refers to similar elements.

Referring to FIG. 5A, first and second data lines Da' and Db' may extend from a display area PXA (see FIG. 3) to a non-display area PPA in a first direction. FIG. 5A illustrates an embodiment where the first and second data lines Da' and Db' extend in an inclined direction with respect to first and second power lines E1 and E2.

At least some of the first data lines Da' and the second data lines Db' may overlap. The first data lines Da' and the second data lines Db' may be disposed with a predetermined distance therebetween, but are not limited thereto, and the first data lines Da' and the second data lines Db' may be disposed with different and/or variable distances therebetween.

A region, in which the first data line Da' and the second data line Db' overlap, may be disposed between the first power line E1 and the second power line E2.

Next, a structure of a wiring unit in the non-display area PPA will be described in a lamination sequence.

Referring to FIG. 5B, first, the first data lines Da' are provided on a substrate SUB. A first insulating layer IL1 covering the first data lines Da' may be disposed on the first data lines Da'.

The second data lines Db' may be disposed on the first insulating layer IL1, and at least some of the second data lines Db' may not to overlap the first data lines Da'. FIG. 5B illustrates that the second data lines Db' partially overlap the first data lines Da', but are not limited thereto, and the second data lines Db' may completely overlap the first data lines.

A second insulating layer IL2 covering the second data lines Db' may be disposed on the second data lines Db', and the first and second power lines E1 and E2 may be disposed on the second insulating layer IL2.

The first power line E1 and the second power line E2 may be formed on different layers. Thus, the first power line E1 and the second power line E2 may be formed using different materials in different processes. Further, at least some of the first and second power lines E1 and E2 may be disposed overlapping one another.

A third insulating layer IL3 covering the first and second power lines E1 and E2 may be disposed on the first and second power lines E1 and E2.

The display device described herein has an advantage in that, because the second data lines Db' overlap the first data lines Da', and the overlapping region is positioned between the first power line E1 and the second power line E2, it is possible to prevent the first power line E1 and the second power line E2 from being short-circuited.

This will be described in detail below. As described with reference to FIG. 4B, when the second data lines Db' is formed on the first insulating layer IL1 as wires and the second insulating layer IL2 is formed on the first insulating layer IL1, a first recessed portion V1 may be formed when viewed on a plane. A conductive layer within the first recessed portion V1 might not be completely removed, and the conductive layer, which is not completely removed, is left behind as a residue to cause a short circuit between the first power line E1 and the second power line E2.

When at least a part of the second data lines Db overlaps the first data line Da', the first recessed portion V1 illustrated in FIG. 4B may not be formed.

Accordingly, even though a conductive layer is formed and the conductive layer is patterned by photography, lithography and/or the like in order to form the first power line E1 and the second power line E2 on an upper surface of the second insulating layer IL2, the first recessed portion V1 is not generated, so that the residue is not generated, and the space between the first power line E1 and the second power line E2 may be completely, or at least substantially, electrically insulated.

The display device of FIGS. 6A to 6C will be described focusing on differences between the display device illustrated in FIGS. 4A to 4C in order to avoid duplicate descriptions. Parts having like or similar part numbers and that are not described with reference to FIGS. 6A to 6C, will follow the previous descriptions of those parts, and the same reference numeral refers to the same element, and the similar reference numeral refers to the similar element.

Figure 6A:
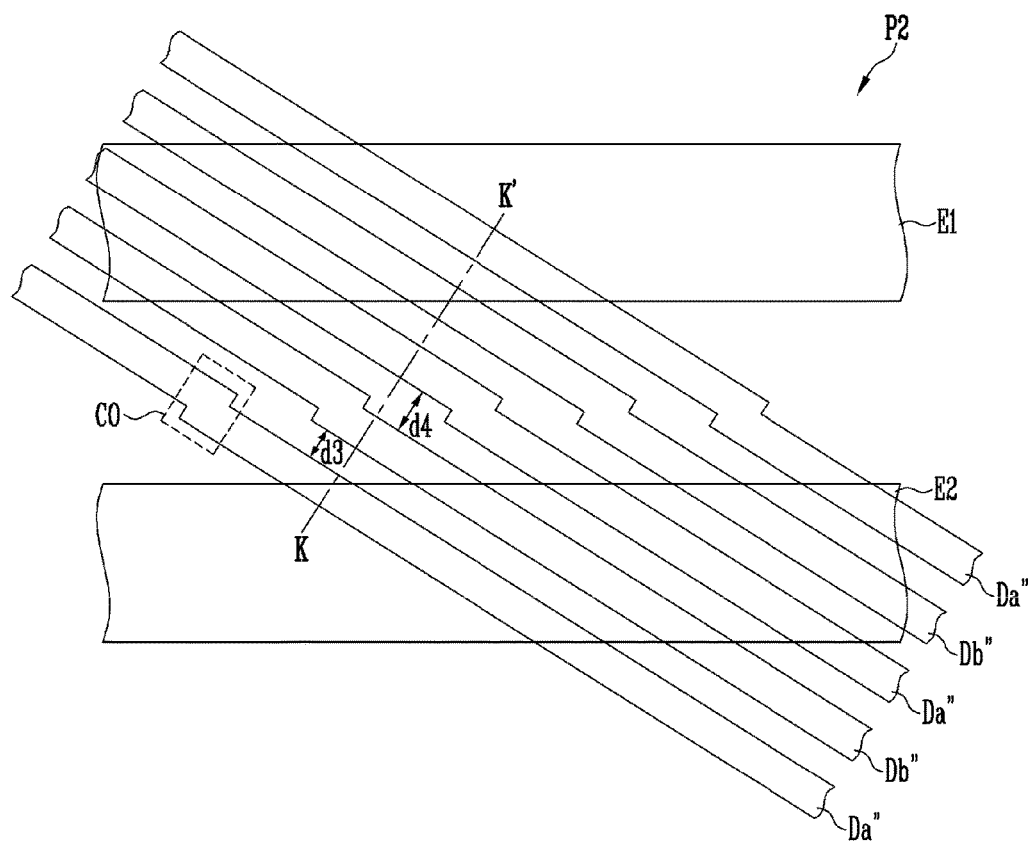
FIG. 6A is a fragmented top plan view of a third embodiment of area P2 of FIG. 3.
Figure 6B:
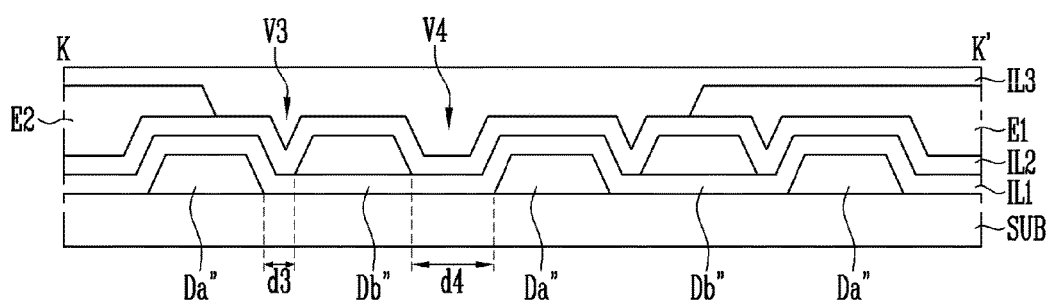
FIGS. 6B and 6C are cross-sectional views of alternative embodiments taken along line K-K' of FIG. 6A.
Figure 6C:
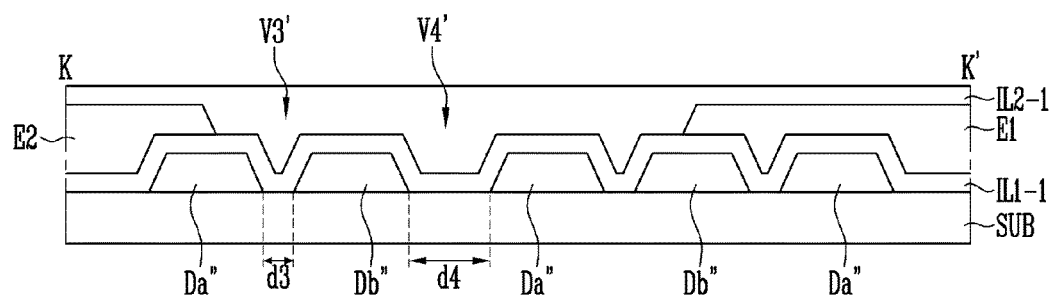

FIG. 6A is a top plan view illustrating a portion corresponding to P2 of FIG. 3 according to still another exemplary embodiment of the present disclosure in detail, and FIGS. 6B and 6C are cross-sectional views taken along line K-K' of FIG. 6A.

Referring to FIG. 6A, first and second data lines Da" and Db" may extend from a display area PXA (see FIG. 3) to a non-display area PPA in a first direction. FIG. 6A illustrates an exemplary embodiment where the first and second data lines Da" and Db" extend in an inclined direction with respect to first and second power lines E1 and E2.

The first data lines Da" and the second data lines Db" may be alternately disposed. Further, the first data lines Da" and the second data lines Db" may be disposed with a predetermined third distance d3 therebetween, but are not limited thereto, and the first data lines Da" and the second data lines Db" may be disposed with different and/or variable distances therebetween.

At least some of the first data lines Da" and the second data lines Db" may be parallel or substantially parallel to each other.

Each of the first and second data lines Da" and Db" may have a contoured portion CO, which is angled in a direction different from the first direction. As illustrated, the contoured portion CO consists of linear segments connected by right angles. However, it should be apparent that, in other embodiments, the contoured portion CO may include one or more curved or non-linear segments and/or connections between segments that form angles other than right angles.

FIG. 6A illustrates that all of the first and second data lines Da" and Db" include the contoured portion CO, but in some embodiments, the contoured portion CO might be formed in only one of the adjacent first and second data lines Da" and Db". For example, the contoured portion CO may be formed in the first data lines DA", but the contoured portion CO might not be formed in the second data lines Db".

Each of the first and second data lines Da" and Db" may include one contoured portion CO, or a plurality of contoured portions CO.

In some embodiments, the number of contoured portions CO included in each of the first data lines Da" and the second data line Db" may be different. For example, each of the first data lines Da" may have r contoured portions CO (r is a natural number), and each of the second data lines Db" may have s contoured portions CO (s is a natural number different from r).

In some embodiments, at least a part of the first data lines Da" may have a different number of contoured portions CO than others. For example, some of the first data lines Da" may have t contoured portions CO (t is a natural number), and the remaining of the first data lines Da" may have u contoured portions CO (u is a natural number different from t). At least some of the second data lines Db" may also have the different number of contoured portions CO similar to that described above in connection with the first data lines Da".

The contoured portions CO included in the first and second data lines Da" and Db" may be disposed between the first power line E1 and the second power line E2. Further, when each of the first and second data lines Da" and Db" includes a plurality of contoured portions CO, at least one contoured portion CO may be disposed between the first power line E1 and the second power line E2.

When the first and second data lines Da" and Db" are alternately disposed while being spaced apart from each other by a third distance d3, a space having a fourth distance d4 may be formed between the adjacently disposed first data lines Da" and second data lines Db". The fourth distance d4 is larger than the third distance d3, and the spaced space may be formed by the contoured portions CO included in the first data lines Da" and the second data lines Db".

Further, similar to the first and second data lines Da" and Db", each of the first and second power lines E1 and E2 may include one contoured portion or a plurality of contoured portions.

Next, a structure of a wiring unit in the non-display area PPA will be described in a lamination sequence.

Referring to FIG. 6B, first, the first data lines Da" are provided on a substrate SUB. The first data lines Da" may be disposed with a predetermined distance therebetween or different and/or variable distances therebetween. A first insulating layer IL1 covering the first data lines Da" may be disposed on the first data lines Da". The second data lines Db" may be disposed on the first insulating layer IL1, and the second data lines Db" may be disposed so as not to overlap the first data lines Da". The first data lines Da" and the second data lines Db" may be spaced apart from each other with the third distance d3.

A space having the fourth distance d4 may be formed between the first and second data lines Da" and Db" by the contoured portion CO formed in the first and second data lines Da" and Db".

A second insulating layer IL2 covering the second data lines Db" may be disposed on the second data lines Db", and the first and second power lines E1 and E2 may be disposed on the second insulating layer IL2.

A third insulating layer IL3 covering the first and second power lines E1 and E2 may be disposed on the first and second power lines E1 and E2.

Referring to FIG. 6C, the first data lines Da" and the second data lines Db" are provided on a substrate SUB. Each of the first data lines Da" and the second data lines Db" may be disposed with a predetermined distance therebetween or different and/or variable distances therebetween. A first insulating layer IL1-1 covering the first data lines Da" and the second data lines Db" may be disposed on the first data lines Da" and the second data lines Db".

The first data lines Da" and the second data lines Db" may be spaced apart from each other with the third distance d3.

A space having the fourth distance d4 may be formed between the first and second data lines Da" and Db" by the contoured portion CO formed in the first and second data lines Da" and Db".

The first and second power lines E1 and E2 may be disposed on the first insulating layer IL1-1.

The first power line E1 and the second power line E2 may be formed on different layers. Thus, the first power line E1 and the second power line E2 may be formed by using different materials in different processes.

A second insulating layer IL2-1 covering the first and second power lines E1 and E2 may be disposed on the first and second power lines E1 and E2.

The display device described herein has an advantage in that, when the contoured portions CO formed in the first and second data lines Da" and Db" are disposed in the first and second power lines E1 and E2, it is possible to prevent the first power line E1 and the second power line E2 from being short-circuited.

This will be described in detail below. Like the exemplary embodiment illustrated in FIG. 6B, when the second data lines Db" are formed on the first insulating layer IL1 as wires and the second insulating layer IL2 is formed on the first insulating layer IL1, third recessed portions V3 may be formed between the first data lines Da" and the second data lines Db", which are disposed with the third distance V3. Even though a conductive layer is formed on the second insulating layer IL2 and the conductive layer is patterned by photography, lithography, and the like, the conductive layer within the third recessed portion V3 might not be completely removed, and the conductive layer, which is not completely removed, is left behind as a residue to cause a short circuit between the first power line E1 and the second power line E2.

Further, in the exemplary embodiment illustrated in FIG. 6C, when a space between the first data line Da" and the second data line Db" is very narrow, a width of a third recessed portion V3' may also be formed very small.

In this state, even though a conductive layer is formed on the first insulating layer IL1-1 and the conductive layer is patterned, the conductive layer within the third recessed portion V3' might not be completely removed, and the conductive layer, which is not completely removed, is left behind as a residue to cause a short circuit between the first power line E1 and the second power line E2.

According to still another exemplary embodiment, like the exemplary embodiment illustrated in FIG. 6B, the space having the fourth distance d4 may be formed by the contoured portions CO included in the first and second data lines Da" and Db", and a fourth recessed portion V4 may be formed between the first data lines Da" and the second data lines Db" by the space. The fourth distance d4 between the first and second data lines Da" and Db", in which the fourth recessed portions V4 are formed, is larger than the third distance d3. Accordingly, when a conductive layer is formed and the conductive layer is patterned by photolithography and the like in order to form the first and second power lines E1 and E2 on an upper surface of the second insulating layer IL2, the conductive layer within the fourth recessed portion V4 may be completely removed due to the large width of the fourth recessed portion V4. Accordingly, the first power line E1 and the second power line E2 may be completely, or substantially, electrically insulated by the third insulating layer IL3.

Further, in the exemplary embodiment illustrated in FIG. 6C, a fourth recessed portion V4', which is wider than the third recessed portion V3', may be formed between the first data line Da" and the second data line Db". Accordingly, a conductive layer within the fourth recessed portion V4' may be completely removed due to the large width of the fourth recessed portion V4', and the first power line E1 and the second power line E2 may be completely or substantially electrically insulated by the second insulating layer IL2-1.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device, comprising:
   a substrate including a display area and a non-display area;
   pixels disposed in the display area;
   a first wire extending from the pixels to the non-display area and disposed on the substrate;
   a first insulating layer covering the first wire;
   a second wire extending from the pixels to the non-display area and disposed on the first insulating layer;
   a second insulating layer covering the second wire; and
   first and second power lines disposed on the second insulating layer in the non-display area,
   wherein the first wire is spaced apart from the second wire by a first distance and a second distance that is different from the first distance in a region between the first and second power lines.

2. The display device of claim 1, wherein the first wire includes a plurality of first wires, the second wire includes a plurality of second wires, and respective ones of the plurality of first wires and the plurality of second wires are alternately disposed.

3. The display device of claim 1, wherein the first wire includes a first contoured portion, and the second wire includes a second contoured portion.

4. The display device of claim 3, wherein the first contoured portion and the second contoured portion face each other.

5. The display device of claim 3, wherein the first contoured portion and the second contoured portion are alternately disposed so as to not face each other.

6. The display device of claim 1, wherein each of the first and second power lines supplies different power supply voltages to the pixels.

7. The display device of claim 6, wherein the first and second power lines surround the display area.

8. The display device of claim 1, wherein each of the first and second wires supplies a data signal to the pixels.

9. The display device of claim 1, wherein the first and second power lines are formed of the same material.

10. The display device of claim 1, wherein the first and second power lines are formed of different materials.

11. The display device of claim 1, wherein widths of the first and second wires are the same.

12. The display device of claim 1, wherein widths of the first and second wires are different from each other in at least one portion of each of the first and second wires.

13. The display device of claim 1, wherein at least some of the first and second wires have a contoured portion.

14. The display device of claim 13, wherein at least a part of the first wire and at least a part of the second wire are disposed to be parallel to each other.

* * * * *